United States Patent [19]
Tanino

[11] Patent Number: 4,910,472
[45] Date of Patent: Mar. 20, 1990

[54] MULTIVIBRATOR CIRCUIT EMPLOYING FIELD EFFECT DEVICES

[75] Inventor: Noriyuki Tanino, Hyogo, Japan

[73] Assignee: Mitsubishi Denki Kabushiki Kaisha, Tokyo, Japan

[21] Appl. No.: 204,127

[22] Filed: Jun. 6, 1988

[30] Foreign Application Priority Data

Jun. 9, 1987 [JP] Japan ................................ 62-144382
Jun. 9, 1987 [JP] Japan ................................ 62-144383
Jun. 30, 1987 [JP] Japan ................................ 62-164302

[51] Int. Cl.$^4$ ........................................... H03K 3/281
[52] U.S. Cl. .............................................. 331/113 R
[58] Field of Search ............. 331/113 R, 144; 332/14; 307/290

[56] References Cited

U.S. PATENT DOCUMENTS 3,855,551 12/1974 Ishigaki et al. ................. 331/113 R
4,468,636 8/1984 Monticelli .

FOREIGN PATENT DOCUMENTS 0020868 7/1981 European Pat. Off. .

OTHER PUBLICATIONS

Finvers et al., Analysis of a Source-Coupled CMOS Mulitvibrator, IEEE Trans. on Circuits and Systems, vol. 35, No. 9, Sep. 1988.
R. Epworth, "The Phenomenon of Modal Noise in Analog and Digital Optical Fiber Systems", Proc. 4th European Conference on Optical Communications, Genova, Italy (Sep. 1978): 492, 501.
J. Vanderwall et al, "Suppression of Some Artifacts of Modal Noise in Fiber Optic Systems", Opt. Lett., vol. 4, No. 9 (Sep. 1979): 295, 296.
K. Sato et al, "Speckle Noise Reduction in a Fiber Optic Analog Video Transmission Using Semiconductor Laser Diodes", IEEE Transactions on Communications, vol. COM-29, No. 7 (Jul. 1981): 1017, 1024.
Patent Abstracts of Japan, vol. 9, No. 288(E-358)(2011), 15 Nov. 1985.
A. Grebene, Bipolar and MOS Analog Integrated Circuit Design (1984): 571, 575.

Primary Examiner—Eugene R. LaRoche
Assistant Examiner—Robert J. Pascal
Attorney, Agent, or Firm—Lowe, Price, LeBlanc, Becker & Shur

[57] ABSTRACT

A multivibrator circuit employing field effect transistors which operates with a high oscillation frequency and low power consumption comprises four series connections. The first series connection comprises a parallel connection including a resistor $R_1$ and a diode $D_1$ connected in parallel, and two field effect transistors $Q_1$ and $Q_3$, the first series connection being provided between the power supply $V_{DD1}$ and the ground $V_{SS}$. The second series connection comprises a field effect transistor $Q_5$, diodes $D_3$ for shifting a level and a field effect transistor $Q_7$, the second series connection being provided between the power supply $V_{DD2}$ and the ground $V_{SS}$. The third series connection comprises $R_2$, a diode $D_2$ and two field effect transistors $Q_2$ and $Q_4$ in the same manner as in the first series connection. The fourth series connection comprises a field effect device $Q_6$, diodes $D_4$ for shifting a level and a field effect device $Q_8$ in the same manner as in the second series connection. The first and second outputs are connected to the second and fourth series connections, respectively. A capacitor $C_1$ is connected between the sources of the field effect transistors $Q_1$ and $Q_2$.

10 Claims, 6 Drawing Sheets

MULTIVIBRATOR CIRCUIT EMPLOYING FIELD EFFECT DEVICES

BACKGROUND OF THE INVENTION

1. Field of the Invention

The present invention relates to a multivibrator circuit and, more particularly, to a multivibrator circuit employing field effect devices for outputting an output signal of a high oscillation frequency.

2. Description of the Prior Art

FIG. 1 is a schematic diagram showing a emitter-coupled multivibrator circuit employing conventional silicon npn type bipolar transistors. A similar circuit is described in "Bipolar and MOS Analog Integrated circuit Design" by A. B. Grebene, published by Micro-Linear Corporation in 1984.

Referring to FIG. 1, the multivibrator circuit comprises four series connections between a power supply $V_{cc}$ and the ground $V_{ee}$. The first series connection comprises a first parallel connection of a resistor $R_{11}$ and a diode $D_{11}$, and npn type bipolar transistors $Q_{11}$ and $Q_{13}$. The emitter of the transistor $Q_{11}$ and the collector of the transistor $Q_{13}$ are connected together to constitute a node $N_{13}$. The second series connection comprises npn type bipolar transistors $Q_{15}$ and $Q_{17}$. The emitter of the transistor $Q_{15}$ and the collector of the transistor $Q_{17}$ are connected together to constitute a node $N_{11}$. The node $N_{11}$ is connected to a first output $OUT_1$. The base of the transistor $Q_{15}$ is connected to a connection point between the collector of the transistor $Q_{11}$ and the first parallel connection. The third series connection comprises a second parallel connection of a resistor $R_{12}$ and a diode $D_{12}$, and npn type bipolar transistors $Q_{12}$ and $Q_{14}$. The emitter of the transistor $Q_{12}$ and the collector of the transistor $Q_{14}$ are connected together to constitute a node $N_{14}$. The base of the transistor $Q_{12}$ is connected to the first output $OUT_1$. A capacitor $C_{11}$ is connected between the node $N_{13}$ and the node $N_{14}$. The bases of the transistors $Q_{13}$ and $Q_{14}$ are connected together and a connection point therebetween is connected to a first constant voltage supply $V_{co}$. The fourth series connection comprises npn type bipolar transistors $Q_{16}$ and $Q_{18}$. The emitter of the transistor $Q_{16}$ and the collector of the transistor $Q_{18}$ are connected together to constitute a node $N_{12}$. The node $N_{12}$ is connected to a second output $\overline{OUT_2}$. The base of the transistor $Q_{16}$ is connected to a connection point between the collector of the transistor $Q_{12}$ and the second parallel connection. The base of the transistor $Q_{11}$ is connected to the second output $\overline{OUT_2}$. The bases of the transistors $Q_{17}$ and $Q_{18}$ are connected together and the connection point therebetween is connected to a second constant supply voltage $V_{CB}$.

Next, description is made of operation of the circuit.

Either one of the transistors $Q_{11}$ and $Q_{12}$ constituting an emitter-coupled switch is always on and the other is off.

First, assuming that the transistor $Q_{11}$ is off and the transistor $Q_{12}$ is on, a current I flows from the node $N_{14}$ to the node $N_{13}$ through the capacitor $C_{11}$ because the current I is always flowing through the transistors $Q_{13}$ and $Q_{14}$ serving as constant current load in response to a voltage applied to a first control input. Therefore, a current of 2I flows through the transistor $Q_{12}$. A collector voltage of the transistor $Q_{12}$ is decreased by a voltage of $2IR_2$ by a resistor $R_{12}$ (a resistance value is also represented by $R_{12}$). Since a barrier voltage $\phi_B$ of the diode $D_{12}$ and a value ($R_{12}$) of the resistor $R_{12}$ are selected so as to satisfy the relation of $2IR_{12} \geq \phi_B$, the collector voltage of the transistor $Q_{12}$ is clamped at $V_{cc}\text{-}\phi_B$. As a result, an emitter voltage V ($N_{12}$) of the transistor $Q_{16}$ becomes $V_{cc}\text{-}2\phi_B$ which is lower than a base voltage $V_{cc}\text{-}\phi_B$ by the voltage $\phi_B$.

On the other hand, when an emitter voltage V ($N_{13}$) of the transistor $Q_{11}$ is reduced by the current I flowing through the capacitor $C_{11}$ and becomes $V_{cc}\text{-}3\phi_B$ which is lower than the base voltage $V_{cc}\text{-}2\phi_B$ of the transistor $Q_{11}$ by the voltage $\phi_B$, the transistor $Q_{11}$ is turned on. As a result, a base voltage of the transistor $Q_{15}$ is reduced from $V_{cc}$ to $V_{cc}\text{-}\phi_B$ and an emitter voltage V ($N_{11}$) of the transistor $Q_{15}$ is reduced from $V_{cc}\text{-}\phi_B$ to $V_{cc}\text{-}2\phi_B$. Since an emitter voltage V ($N_{14}$) of the transistor $Q_{12}$ changes with a delay of a sufficiently large time constant by the capacitor $C_{11}$ as compared with switching operation of the transistors $Q_{11}$ and $Q_{12}$, it is equal to an emitter voltage of $V_{cc}\text{-}2\phi_B$ when the transistor $Q_{12}$ is on. Therefore, the transistor $Q_{12}$ is turned off.

After the transistor $Q_{12}$ is turned off, the base voltage of the transistor $Q_{11}$ is raised by a voltage $\phi_B$ and the voltages V ($N_{13}$) and V ($N_{14}$) across the capacitor $C_{11}$ are raised from $V_{cc}\text{-}3\phi_B$ to $V_{cc}\text{-}2\phi_B$ and from $V_{cc}\text{-}2\phi_B$ to $V_{cc}\text{-}\phi_B$, respectively. As a result, the states of the transistors $Q_{11}$ and $Q_{12}$ initially set have been changed with each other.

FIG. 2 is a timing chart showing changes of the first and second output voltages V ($N_{11}$) and V ($N_{12}$) of the emitter-coupled multivibrator circuit in FIG. 1 and the voltages V ($N_{14}$) and V ($N_{13}$) of the nodes $N_{14}$ and $N_{13}$ as well as a change of the voltage difference V ($N_{14}$)-V ($N_{13}$) across the capacitor $C_{11}$.

An oscillation frequency $f_0$ of the multivibrator circuit shown in FIG. 1 is represented by the following equation;

$$f_0 = \frac{I}{4C\phi_B}$$

where C is a capacitance value of the capacitor $C_{11}$, I is a current flowing through the transistors $Q_{13}$ and $Q_{14}$ for constant current loads of the emitter-coupled switch portion, and reference $2\phi_B$ is a maximum amplitude voltage applied across the capacitor $C_{11}$. Since the current I can be controlled by a voltage $V_{co}$ applied to the bases of the transistors $Q_{13}$ and $Q_{14}$, the emitter-coupled multivibrator circuit shown in FIG. 1 is a voltage-controlled type oscillation circuit.

Since the conventional emitter-coupled multivibrator circuit shown in FIG. 1 employs a silicon bipolar transistor, it involves disadvantages such as a low oscillation frequency and a large power consumption.

SUMMARY OF THE INVENTION

A primary object of the present invention is to provide a multivibrator circuit having a high oscillation frequency and operating with low power consumption. In brief, the present invention comprises a first series connection including first voltage drop means, a first field effect device of a certain conductivity type and first current source means, provided between a first power supply and the ground; a second series connection including first level-shifting means and second current source means, provided between one electrode of the first field effect device and the ground; a third series connection including second voltage drop means, a second field effect device or certain conductivity type and third power supply means, provided between the first current source means and the ground; a fourth series connection including second level-shifting means and fourth current source means, provided between one electrode of the second field effect device and the ground; and capacitance means connected between the other electrodes of the respective first and second field effect devices. One electrode of the first field effect device is connected to the first voltage drop means and the other electrode is connected to the first current source means. A connection point between the first level-shifting means and the second current source means constitutes a first output. The first level-shifting means receives a voltage of one electrode of the first field effect device and the level-shifted voltage is applied to the first output. One electrode of the second field effect device is connected to the second voltage drop means and the other electrode is connected to the third current source means. A connection point between the second level-shifting means and the fourth current source means constitutes a second output. The second level-shifting means receives a voltage of one electrode of the second field effect device and the level shifted voltage is applied to the second output. The control electrode of the first field effect device is connected to the second output and the control electrode of the second field effect device is connected to the first output.

According to the present invention, one of the first and second field effect devices is always on and the other is off and oscillation operation is performed by repeatedly changing their states alternately. Assuming that the first filed effect device is off and that the second field effect device is on, the second voltage drop means applies a voltage, which has been reduced from a voltage of the first power supply due to a current flowing thereto, to the second level-shifting means. The second level-shifting means receives the reduced voltage and applies the level-shifted voltage to the control electrode of the first field effect device. On the other hand, a current always flows into the first and third current source means. While the first field effect device is off, a current flows from the other electrode of the second field effect device to the other electrode of the first field effect device through the capacitance means, and then the current flows into the first current source means. A voltage of the other electrode of the first field effect device is reduced due to this current. When a difference between this voltage and the voltage applied from the second level-shifting means to the control electrode of the first field effect device exceeds a threshold voltage value of the second field effect device, the first field effect device is turned on. When the first field effect device is turned on, the first voltage drop means applies the voltage, reduced from the voltage of the first power supply due to the current flowing thereto, to the first level-shifting means. The first level-shifting means receives the reduced voltage and applies the level-shifted voltage to the control electrode of the second field effect device. Since the voltage of the other electrode of the second filed effect device has been clamped by a sufficiently large time constant by the capacitance means as compared with a switching time of the first and second field effect devices, it is equal to the voltage when the second field effect device is on. A difference between the voltages of the control electrode and the other electrode of the second filed effect device is less than the threshold voltage of the second field effect device, and the second field effect device is turned off. As a result, the operating states of the first and second field effect devices have been changed with each other.

According to the present invention, since a multivibrator circuit employs a field effect device, it can operate with a high oscillation frequency and less power consumption.

In a preferred embodiment, the present invention further comprises temperature compensating means connected to the first and third current source means for compensating for frequency fluctuation of the output signals of the first and second outputs due to a change of ambient temperature.

In the above described preferred embodiment, since the fluctuation of the oscillation frequency due to a change of temperature is compensated for even if the ambient temperature changes, the multivibrator circuit can be operated in an stable manner.

In another preferred embodiment, the capacitance means further comprises means for changing a capacitance value from outside.

According to this preferred embodiment, the oscillation frequency can be changed without changing amounts of current flowing through the first and third current source means, the ambient temperature is prevented from changing and, therefore, the stable multivibrator circuit without any fluctuation of the oscillation frequency can be provided.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
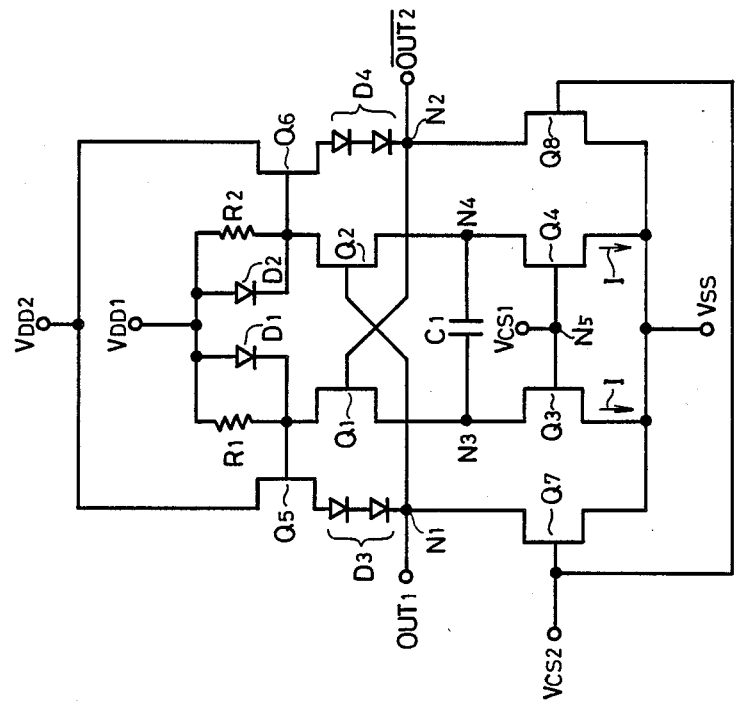
FIG. 3 is a schematic diagram showing one example of a multivibrator circuit employing a field effect transistor in accordance with the present invention.
Figure 1:
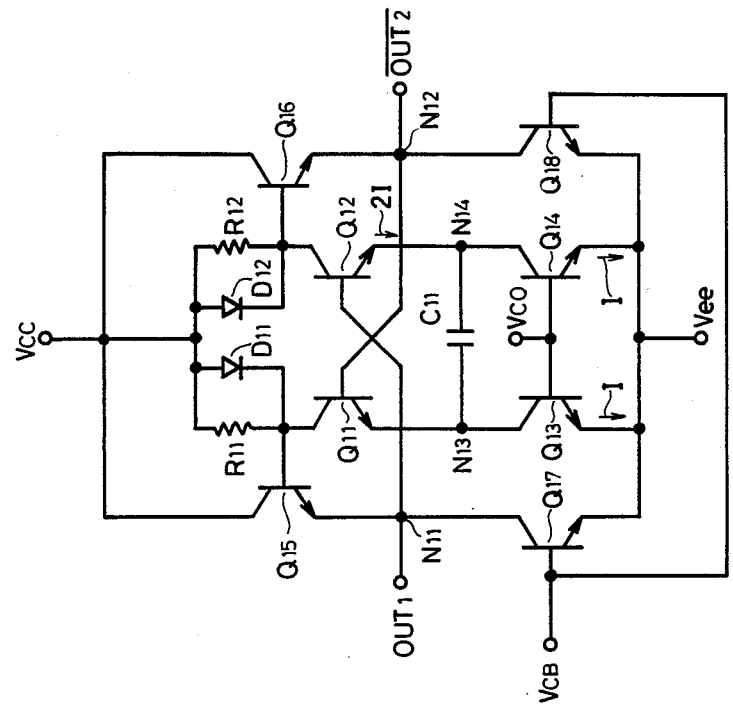
FIG. 1 is a schematic diagram showing a multivibrator circuit employing a conventional npn type bipolar transistor.
Figure 2:
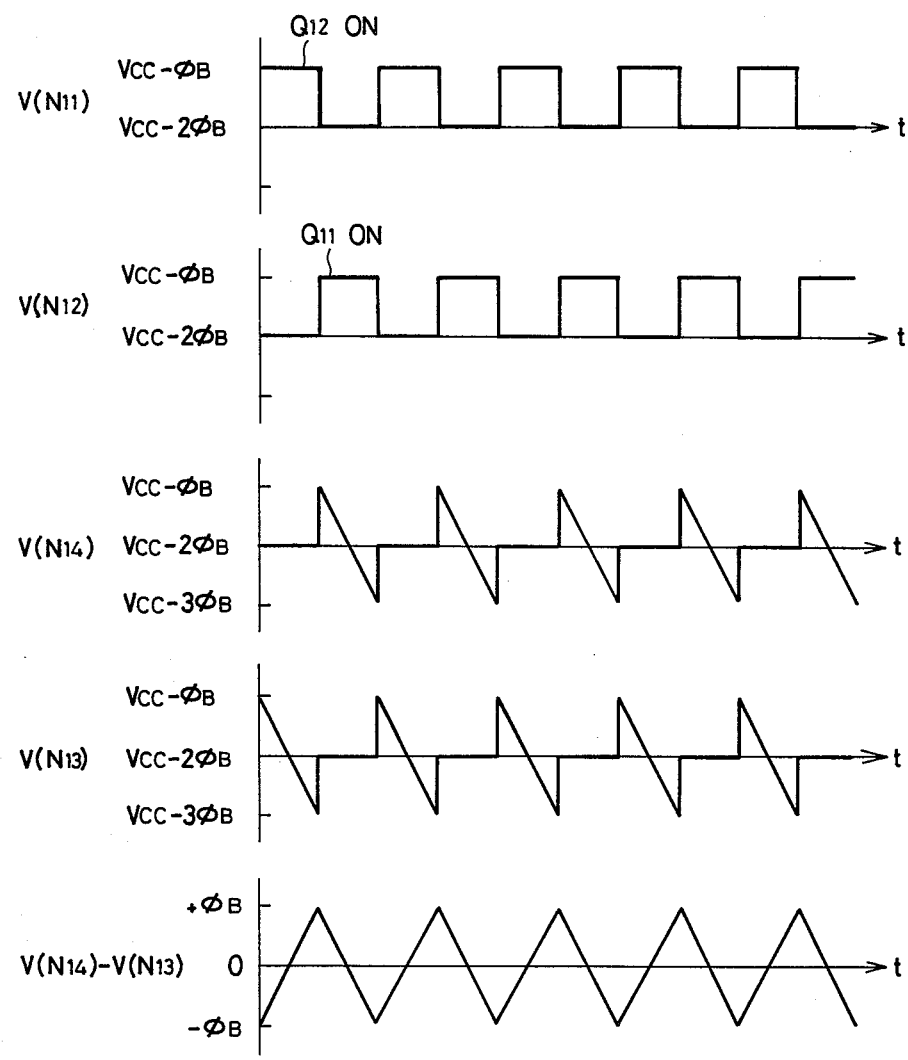
FIG. 2 is a timing chart for explaining operation of the multivibrator circuit in FIG. 1.

FIG. 3 is a schematic diagram showing one example of a multivibrator circuit employing field effect transistors in accordance with the present invention.

Referring to FIG. 3, the multivibrator circuit employing field effect transistors comprises four series connections. The first and third series connections are provided between a first power supply $V_{DD1}$ and the ground $V_{SS}$. The second and fourth series connections are provided between a second power supply $V_{DD2}$ and the ground $V_{SS}$. The first series connection comprises a first clamp circuit in which a resistor $R_1$ and a diode $D_1$ are connected in parallel, an n type field effect transistor $Q_1$ constituting a source-coupled switch and an n type field effect transistor $Q_3$ as a current source. The transistor $Q_1$ has its drain connected to the first clamp circuit and its source connected to the drain of the transistor $Q_3$ together to constitute a node $N_3$. The transistor $Q_3$ has its source connected to the ground $V_{SS}$. The second series connection comprises an n type field effect transistor $Q_5$ constituting a source follower, two diodes $D_3$ for shifting level, and an n type field effect transistor $Q_7$. The transistor $Q_5$ has its drain connected to the second power supply $V_{DD2}$ and the transistor $Q_5$ has its source connected to the anode of the diode $D_3$. The drain of the transistor $Q_7$ and the cathode of the diode $D_5$ are connected together to constitute a node $N_1$. The node $N_1$ is connected to a first output $OUT_1$. The transistor $Q_5$ has its gate connected to a connection point between the drain of the transistor $Q_1$ and the first clamp circuit. The transistor $Q_5$ and the diode $D_3$ constitute a first level shift circuit. The third series connection comprises a second clamp circuit in which a resistor $R_2$ and a diode $D_2$ are connected in parallel, an n type field effect transistor $Q_2$ constituting the source-coupled switch and an n type field effect transistor $Q_4$ as a current source. The transistor $Q_2$ has its drain connected to the second clamp circuit and the transistor $Q_2$ has its source connected together to the drain of the transistor $Q_4$ to constitute a node $N_4$ and its gate connected to the first output $OUT_1$. The transistor $Q_4$ has its source connected to the ground $V_{SS}$. A capacitor $C_1$ is connected between the node $N_3$ and the node $N_4$. Gates of the transistors $Q_3$ and $Q_4$ are connected together and a connection point thereof is connected to a first constant supply voltage $V_{CS1}$. The fourth series connection comprises an n type field effect transistor $Q_6$ constituting a source follower, two diodes $D_3$ for shifting level and an n type field effect transistor $Q_8$. The transistor $Q_6$ has its drain connected to the second power supply $V_{DD2}$ and the transistor $Q_6$ has its source connected to the anode of the diode $D_4$. The transistor $Q_6$ has its gate connected to a connection point of the drain of the transistor $Q_2$ and the second clamp circuit. The transistor $Q_6$ and the diode $D_6$ constitute the second level shift circuit. The transistor $Q_8$ has its drain connected together to be cathode of the diode $D_4$ to constitute a node $N_2$. The node $N_2$ is connected to a second output $\overline{OUT_2}$. The transistor $Q_1$ has its gate connected to the second output. The gates of the transistors $Q_7$ and $Q_8$ are connected together and a connection point thereof is connected to a second constant supply voltage $V_{CS2}$. The transistors $Q_3$ and $Q_4$ are constant power supply and control an amount of current flowing through the transistors $Q_3$ and $Q_4$, respectively, in response to a voltage applied to the first constant supply voltage $V_{CS1}$. The transistors $Q_7$ and $Q_8$ are also constant power supplies and they control an amount of current flowing through the transistors $Q_7$ and $Q_8$, respectively, in response to a voltage applied to the second supply voltage $V_{CS2}$. Resistors $R_1$ and $R_2$ are load resistances of the transistors $Q_1$ and $Q_2$, respectively (the resistance values are $R_1$ and $R_2$, respectively). The diodes $D_1$ and $D_2$ limit a voltage drop due to the resistors $R_1$ and $R_2$, respectively. Both barrier voltages of the diodes $D_1$ and $D_2$ are represented by $\phi_B$.

In general, static characteristics of a field effect transistor is represented by the following equations:

$$
\begin{aligned}
I_D &= K(V_G - V_{TH})^2 : & 0 < V_G - V_{TH} < V_D \\
I_D &= K(2(V_G - V_{TH})V_D - V_D^2) : & V_D < V_G - V_{TH} \\
I_D &= 0 : & V_G - V_{TH} < 0
\end{aligned}
\quad (1)
$$

where $I_D$ is the drain current of the field effect transistor, $V_D$ is the drain voltage, $V_G$ is the gate voltage, $V_{TH}$ is a threshold voltage of the gate and K is a transconductance.

Figure 4:
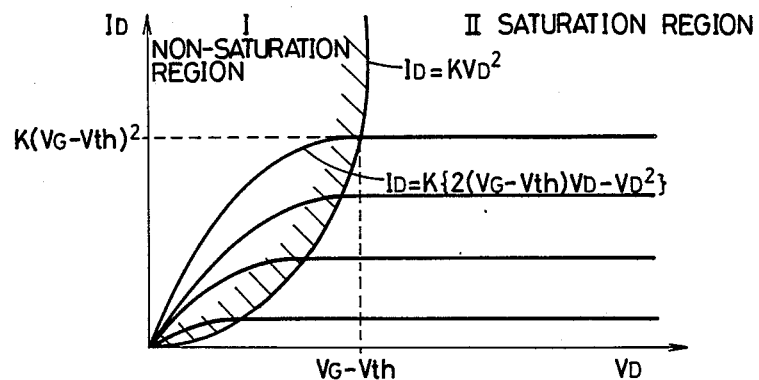
FIG. 4 is a graph showing static characteristics of a drain voltage and a drain current of the field effect transistor.

FIG. 4 is a graph showing static characteristics of the field effect device represented by the equation (1). Referring to FIG. 4, the field effect device performs constant current operation in a saturation region II shown in FIG. 4 regardless of the voltage applied to the drain.

Referring to the field effect transistor multivibrator circuit shown in FIG. 3, it is assumed that the transistors $Q_1$, $Q_2$, $Q_5$, and $Q_6$ operate in a saturation region. Assuming that gate voltages of the transistors $Q_1$, $Q_2$, $Q_5$ and $Q_6$ are threshold voltage $V_{TH}$ when a current $I_1$ flowing through the transistors $Q_3$, $Q_4$, $Q_7$ and $Q_8$, respectively serving as constant current loads is equal to the respective drain currents of the transistors $Q_1$, $Q_2$, $Q_5$ and $Q_6$, the respective source voltages of the transistors $Q_1$ and $Q_2$ are reduced by $V_{TH}$ as compared with the gate voltages when the transistors $Q_1$ and $Q_2$ are on. Respective source voltages of the transistors $Q_5$ and $Q_6$ are reduced by $V_{TH}$ as compared with the gate voltages.

Now, description is made of the operation of the transistors $Q_1$, $Q_2$, $Q_5$ and $Q_6$ in the saturation region.

Assuming that $Q_1$ is off and $Q_2$ is on, the respective source, gate and drain voltages of the transistors $Q_1$, $Q_2$, $Q_5$ and $Q_6$ are shown in table 1.

The field effect transistors operates in the saturation region on conditions that $V_G - V_{TH} < V_D$ from the above described equation (1) is satisfied. Therefore, when the condition of $-\phi_B/2 < V_{TH}$, which solution of inequality has been found from the table 1, is satisfied, the transistors $Q_1$, $Q_2$, $Q_5$ and $Q_6$ operate in the saturation region.

TABLE 1

| | source voltage | gate voltage | drain voltage |
|---|---|---|---|
| $Q_5$ (ON) | $V_{DD1} - V_{TH}$ | $V_{DD1}$ | $V_{DD2}$ |
| $Q_2$ (ON) | $V_{DD1} - 2\phi_B - 2V_{TH}$ | $V_{DD1} - 2\phi_B - V_{TH}$ | $V_{DD1} - \phi_B$ |
| $Q_6$ (ON) | $V_{DD1} - \phi_B - V_{TH}$ | $V_{DD1} - \phi_B$ | $V_{DD2}$ |
| $Q_1$ (OFF) | $V_{DD1} - 3\phi_B - 2V_{TH}$ | $V_{DD1} - 3\phi_B - V_{TH}$ | $V_{DD1}$ |

TABLE 1-continued

| source voltage | gate voltage | drain voltage |
|---|---|---|
| $V_{DD1} - \phi_B - 2V_{TH}$ | | |

When $V_{TH} \leq -\phi_B/2$, the transistors $Q_1$, $Q_2$, $Q_5$ and $Q_6$ can operate in the saturation region by increasing the number of the diodes $D_3$ and $D_4$ in FIG. 3 to three or more.

On the other hand, in the multivibrator circuit shown in FIG. 3, assuming that the relation between $\phi_B$ and $V_{TH}$ is $-\phi_B \leq V_{TH} \leq -^{100} B/2$, the transistor $Q_2$ operates in a non-saturation region and the transistors $Q_1$, $Q_5$ and $Q_6$ operate in the saturation region, as it is obvious from the table 1. The voltage between the gate and source of the transistor $Q_2$ is reduced by more than $V_{TH}$ and a maximum voltage amplitude across the capacitor $C_1$ is less than $2\phi_B$ and dependent on the $V_{TH}$. Therefore, a high oscillation frequency is provided and it is more difficult to control the threshold voltage $V_{TH}$ than to control $\phi_B$. As a result, an oscillation frequency can not be provided with good repeatability.

Description is now made of the multivibrator circuit in FIG. 3.

Either one of the transistors $Q_1$ and $Q_2$ constituting the source-coupled switch is on and the other is off.

First, assuming that the transistor $Q_1$ is off and the transistor $Q_2$ is on, a current I flows from the node $N_4$ to the node $N_3$ through the capacitor $C_1$ because the current I always flows through the respective transistors $Q_3$ and $Q_4$ serving as the current sources. Therefore, a current of 2I flows through the transistor $Q_2$. Although a drain voltage of the transistor $Q_2$ is reduced by $2IR_2$ by the resistor $R_2$, the drain voltage of the transistor $Q_2$ is clamped at $V_{DD1}-\phi_B$ if the value of the resistor $R_2$ is selected as a barrier voltage $\phi_B$ of the diode $D_2$ so as to satisfy the relation of $2IR_2 \geq \phi_B$. As a result, the source voltage of the transistor $Q_6$ becomes a voltage of $V_{DD1}-\phi_B-V_{TH}$ which is lower than a gate voltage of $V_{DD1}-\phi_B$ by the threshold voltage $V_{TH}$ of the transistor $Q_6$. At this time, the level of the gate voltage V ($N_2$) of the transistor $Q_1$ is shifted to $V_{DD1}-3\phi_B-V_{TH}$ by a level shift diode $D_4$.

On the other hand, the source voltage V ($N_3$) of the transistor $Q_1$ is reduced by the current I flowing through the capacitor $C_1$. When the source voltage of the transistor $Q_1$ becomes a voltage of $V_{DD1}-3\phi_B-V_{TH}$ which is lowered than the gate voltage $V_{DD1}-3\phi_B-V_{TH}$ of the transistor $Q_1$ by the threshold voltage $V_{TH}$ of the field effect transistor $Q_1$, the transistor $Q_1$ is turned on.

The gate voltage of the transistor $Q_5$ is reduced from $V_{DD1}$ to $V_{DD1}-\phi_B$ and the source voltage of the transistor $Q_5$ is reduced from $V_{DD1}-V_{TH}$ to $V_{DD1}-\phi_B-V_{TH}$. The gate voltage V ($N_1$) of the transistor $Q_2$ is reduced from $V_{DD1}-2\phi_B-V_{TH}$ to $V_{DD1}-3\phi_B-V_{TH}$ by the level shift diode $D_3$. Since the source voltage ($N_4$) of the transistor $Q_2$ is clamped at sufficiently large time constant by the capacitor $C_1$ as compared with the switching time of two transistors, it is equal to the source voltage $V_{DD1}-2\phi_B-2V_{TH}$ when the transistor $Q_2$ is on. Therefore, the transistor $Q_2$ is turned off.

When the transistor $Q_2$ is turned off, the gate voltage of the transistor $Q_1$ is raised by $\phi_B$ and the voltage V ($N_3$) and V ($N_4$) across the capacitor $C_1$ are raised from $V_{DD1}-3\phi_B-2V_{TH}$ to $V_{DD1}-2\phi_B-2V_{TH}$ and from $V_{DD1}-2\phi_B-2V_{TH}$ to $V_{DD1}-\phi_B-2V_{TH}$, respectively.

As a result, the initial states n which the transistor $Q_1$ was off and the transistor $Q_2$ was on have changed with each other.

Figure 5:
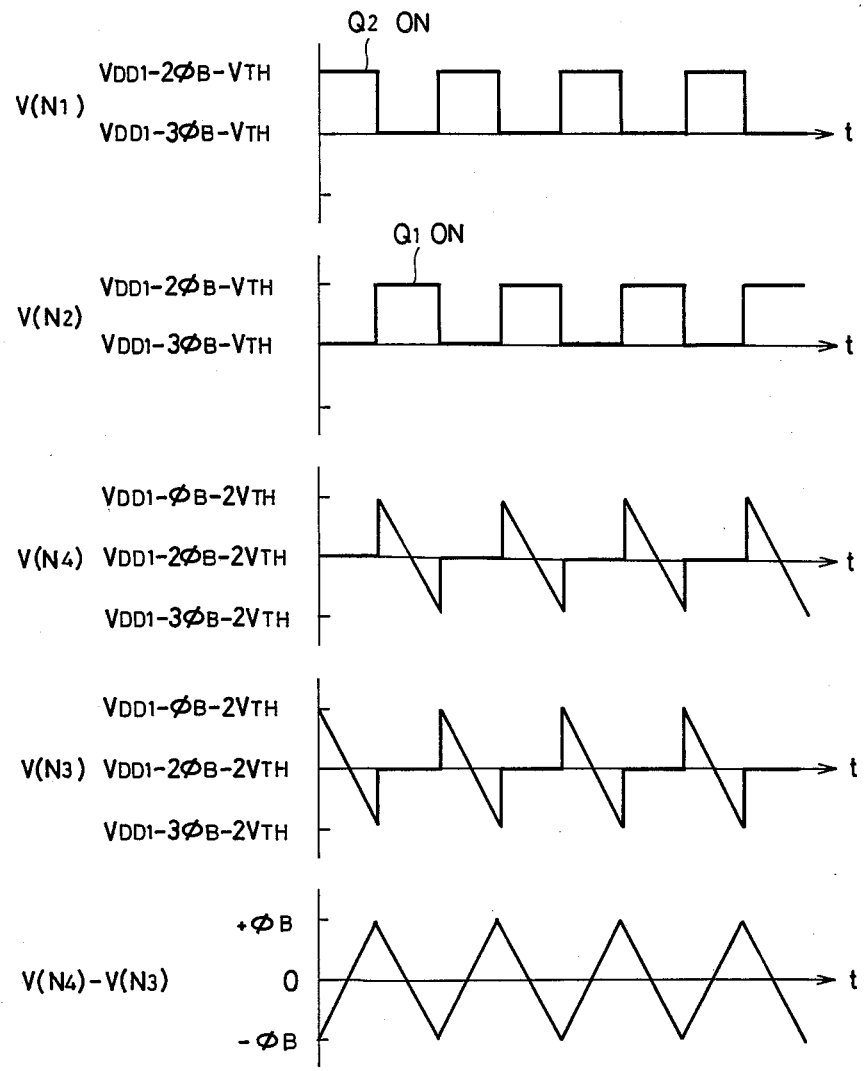
FIG. 5 is a timing chart for explaining operation of the multivibrator circuit shown in FIG. 3.

FIG. 5 is a timing chart showing changes in the voltages V ($N_1$) and V ($N_2$) of the first and second outputs, the potentials V ($N_4$) and V ($N_3$) across the capacitor $C_1$ and the voltage V ($N_4$)-V ($N_3$) across the capacitor in the multivibrator circuit shown in FIG. 3.

An oscillation threshold frequency $f_0$ is determined by capacitance C of the capacitor $C_1$, a current value I flowing through the transistors $Q_3$ and $Q_4$ serving as power supply of the source-coupled switch portion and a maximum amplitude voltage $2\phi_B$ across the capacitor $C_1$ and the following equation is obtained:

$$f_0 = \frac{I}{4C\phi_B} \quad (2)$$

In the field effect transistor multivibrator circuit shown in FIG. 3, the oscillation frequency $f_0$ becomes higher because the oscillation frequency $f_0$ depends on the barrier voltage $\phi_B$ and when the ambient temperature becomes higher, the barrier voltage $\phi_B$ is reduced. The below described improvements will effectively prevent the ambient temperature from affecting the oscillation frequency $f_0$.

Figure 6:
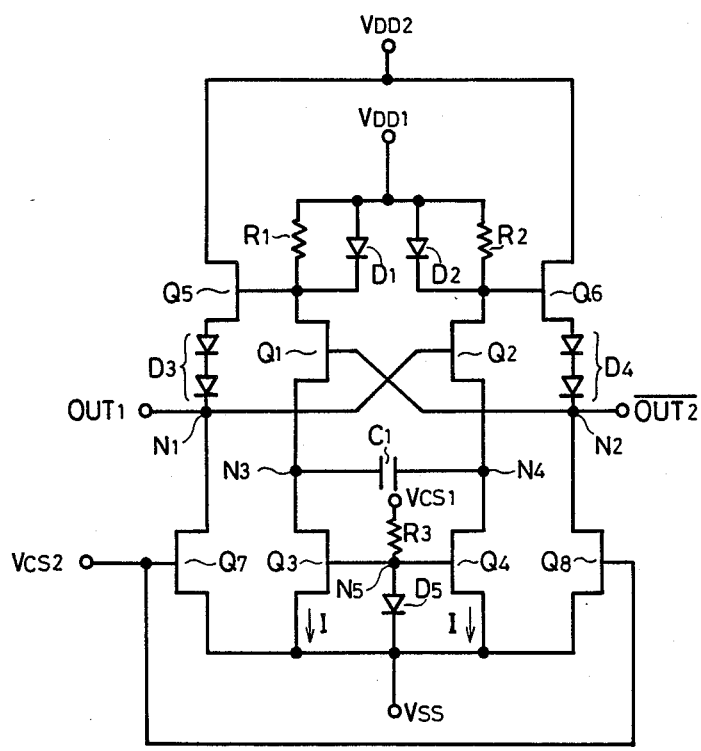
FIG. 6 is a schematic diagram showing another example of a multivibrator circuit employing a field effect transistor in accordance with the present invention.

FIG. 6 is a schematic diagram showing another embodiment of a multivibrator circuit employing field effect transistors in accordance with the present invention.

The multivibrator circuit in FIG. 6 is additionally provided with a bias resistor $R_3$ connected between a first constant supply voltage $V_{CS1}$ and a connection point of gates of the transistors $Q_3$ and $Q_4$, and a diode $D_5$ for temperature compensation connected between the connection point of the gates of the transistors $Q_3$ and $Q_4$ and the ground $V_{SS}$, as compared with the multivibrator circuit in FIG. 3. Although only one diode $D_5$ is shown in FIG. 6, a series connection of one or more diodes may also be applicable. Since other circuit portions of FIG. 6 are the same as those in FIG. 3, a description thereof is omitted.

Next, a description is made of operation of the multivibrator circuit of FIG. 6.

An oscillation frequency $f_0$ of the multivibrator circuit in FIG. 6 is also represented by the equation (2), which is the same as that of the circuit in FIG. 3.

When the ambient temperature is raised during operation, the barrier voltage $\phi_B$ of the diodes $D_1$ and $D_2$ is lowered. However, since the barrier voltage $\phi_B$ of the diode $D_5$ is also lowered at the same time, the gate voltages of the transistors $Q_3$ and $Q_4$ are lowered and the value I of the drain current flowing through the transistors $Q_3$ and $Q_4$ are also reduced. Therefore, since the rise of the oscillation frequency due to the drop of the barrier voltage $\phi_B$ can be offset by the decrease of the drain current value I, the oscillation frequency $f_0$ depends less on the temperature.

A temperature coefficient of the barrier voltage $\phi_B$ is generally represented by $d\phi_B/\phi_B/dT$ and the drain current value I in the saturation region of a field effect transistor is represented by the following equation:

$$I = K(V_g - V_{TH})^2 \quad (3)$$

where $V_g$ is a gate voltage, $V_{TH}$ is a threshold voltage and K is a coefficient.

Referring to FIG. 6, since the gate voltages $V_g$ of the transistors $Q_3$ and $Q_4$ are equal to the barrier voltage $\phi_B$, the equation (3) is also represented by the following equation:

$$I = K(\phi_B - V_{TH})^2 \quad (4)$$

Assuming that both of coefficient K and the temperature coefficient of the threshold voltage $V_{TH}$ are significantly smaller than the temperature coefficient of the barrier voltage $\phi_B$, a temperature coefficient of the drain current I is represented by the following equation:

$$\frac{dI}{I}dT = \frac{2\phi_B}{\phi_B - V_{TH}} \frac{d\phi_B}{\phi_B}/dT \quad (5)$$

and a temperature coefficient of the oscillation frequency $f_0$ is represented by the following equation:

$$\frac{df_0}{f_0}/dT = \frac{dI}{I}/dT - \frac{d\phi_B}{\phi_B}/dT \quad (6)$$
$$= \frac{\phi_B + V_{TH}}{\phi_B - V_{TH}} \cdot \frac{d\phi_B}{\phi_B}/dT$$

Therefore, if the threshold voltage $V_{TH}$ and the barrier voltage $\phi_B$ is selected so as to satisfy the relation of $V_{TH} = -\phi_B$, the temperature coefficient of the oscillation frequency $f_0$ can be reduced to the value which is a product of $$\left| \frac{1}{2} \frac{d\phi_B}{\phi_B}/dT \right|$$

and the temperature coefficient of the oscillation frequency $f_0$ of the multivibrator circuit shown in FIG. 3.

In order to change the oscillation frequency $f_0$ of the multivibrator circuit shown in FIG. 3, as can be also seen from the already described equation (2), it is necessary to change the current I flowing through for the transistors $Q_3$ and $Q_4$. By changing the current I, the ambient temperature of this circuit is changed due to the change of current consumption and, as described above, the oscillation frequency $f_0$ is affected. Since it takes time to make the oscillation frequency $f_0$ stable, the following improvement will be effectively applied.

Figure 7:
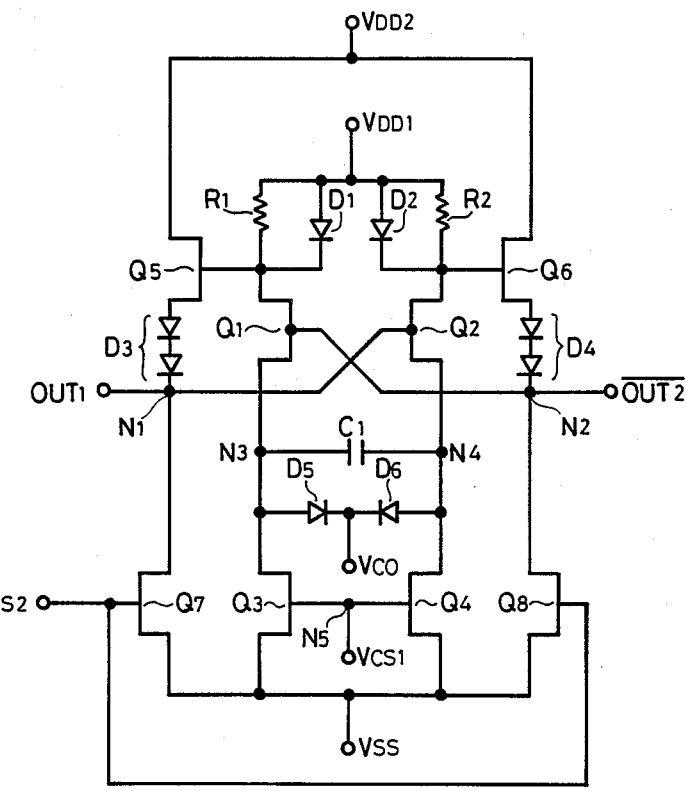
FIG. 7 is a schematic diagram showing still another embodiment of a multivibrator circuit employing a field effect transistor in accordance with the present invention.

FIG. 7 is a schematic diagram showing another embodiment of a multivibrator circuit employing field effect transistors in accordance with the present invention.

Compared with the multivibrator circuit in FIG. 3, the multivibrator circuit in FIG. 7 comprises two diodes having cathodes connected together, provided in series between the sources of the transistors $Q_1$ and $Q_2$. A power supply $V_{CO}$ for controlling the oscillation frequency is connected to the connection point of the cathodes of two diodes. As other circuit portions of FIG. 7 are the same as those in FIG. 3, a description thereof is omitted.

Next, a description is made of operation of the circuit.

An oscillation frequency $f_0$ of the multivibrator circuit of FIG. 7 is also represented by the equation (2) which is the same as that of the circuit in FIG. 3.

Assuming that a capacitance value of a capacitor $C_1$ is $C_1$ and that a junction capacitance value of diodes $D_5$ and $D_6$ is $C_P$, a composite capacitance value C is represented by the following equation:

$$C = C_1 + \frac{1}{2}C_p \quad (7)$$

The junction capacitance value $C_P$ of the diodes $D_5$ and $D_6$ is also represented by the following equation:

$$C_p = \frac{C_o}{\sqrt{\phi_B - V_f}} \quad (8)$$

where $C_o$ is a constant determined by a structure of the diode and $V_f$ is a bias voltage applied in a forward direction to the diodes $D_5$ and $D_6$.

As a result, as is obvious from the equations (3), (7) and (8), the oscillation frequency $f_0$ of the multivibrator circuit shown in FIG. 7 can be controlled by changing a bias voltage applied from the supply voltage $V_{CO}$ for controlling the oscillation frequency to the connection point of cathodes of the diodes $D_5$ and $D_6$. Since the drain current value I of the transistors $Q_3$ and $Q_4$ is always constant, the oscillation frequency is stable without any change of the ambient temperature. Although the capacitor $C_1$ and the series connection of the diodes $D_5$ and $D_6$ are connected in parallel in the mulltivibrator circuit shown in FIG. 7, the capacitor $C_1$ can be dispensed with when the junction capacitance value of the diodes $D_5$ and $D_6$ is large enough for a capacitance necessary for the oscillation.

When the conjunction capacitance value of the diodes $D_5$ and $D_6$ are too large as compared with the capacitance necessary for the oscillation, the capacitance value can be reduced by connecting still another capacitor to the diodes $D_5$ and $D_6$ in series.

It is understood that the number of diodes $D_1$, $D_2$, $D_3$ and $D_4$ of the multivibrator circuit in accordance with the present invention shown in FIGS. 3, 6 and 7 is not limited to the number of diodes shown in the figures and series connection of one or more diodes can be applied.

A description is made of an example of application of the present invention in the following.

With recent developments in optical technologies, a demand for an oscillator having high operating speed and outputting an output signal with a high frequency in a stable manner has been increased.

In an optical disc, optical fiber communication, on optical fiber gyroscope, for example, a high frequency signal is applied to a laser diode using a high frequency superposed circuit in order to reduce a light induced noise due to return light. A single mode laser of a refractive index waveguide type oscillates in a multi-mode, so that a noise due to return light can be effectively reduced. Some reports as indicated below are made with regard to this effect.

(1) Epworth, R. E., "The Phenomenon of Modal Noise in Analog and Digital Optical Fiber Systems", Proc. 4th. Europ. Conf. Opt. Commun. (Genova, Italy), pp.492–501, Sept. 1978.

(2) Vanderwall, J. and Blackburn, J., "Suppression of Some Artifacts of Modal Noise in Fiber-Optic Systems", Opt. Lett., Vol. 4, No. 9, pp. 295–296, Sept. 1979.

(3) Sato, K. and Asatani, K., "Speckle Noise Reduction in Fiber Optic Analog Video Transmission Using Semiconductor Laser Diode", IEEE Tr. Commun., Vol. COM-29, No. 7, pp. 1017-1024, July 1981.

Figure 8:
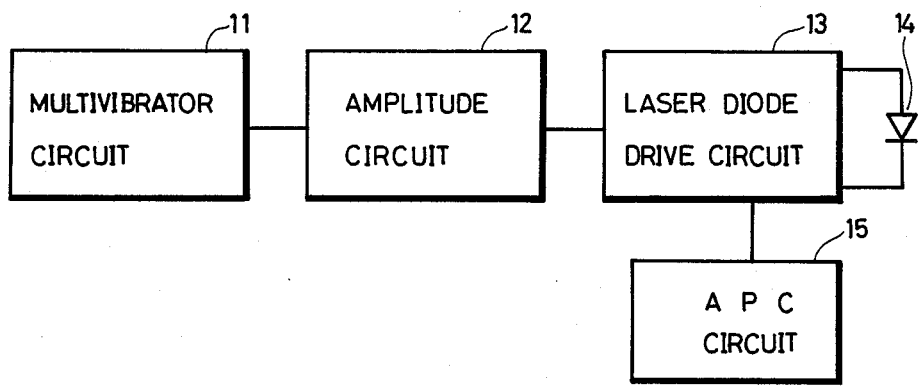
FIG. 8 is a block diagram of a high-frequency superposing circuit for reducing a return light noise of a laser diode for showing an example of application of the present invention.

FIG. 8 is a block diagram of a high frequency superposed circuit for reducing a return light noise of a laser diode as one example of applications of the present invention.

Referring to FIG. 8, the high frequency superposed circuit comprises a multivibrator circuit 11 for high frequency oscillation invention, an amplitude circuit 12 amplifying a signal generated from the circuit 11 and a laser diode drive circuit 13. A laser diode 14 is connected to an output of the laser diode drive circuit 13 and an APC (Automatic Power Control) circuit 15 for adjusting an optical output of the laser diode is also connected to the laser diode drive circuit 13.

Figure 9:
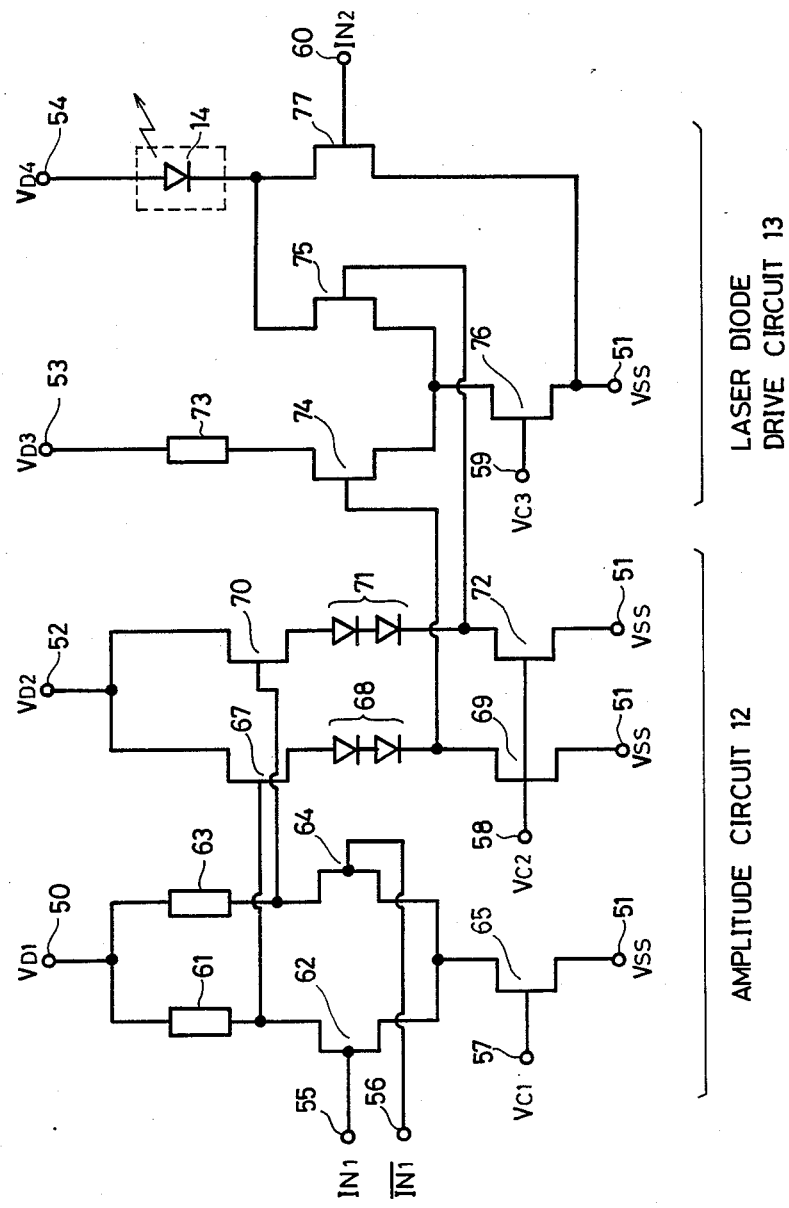
FIG. 9 is a schematic diagram showing an example of an amplification circuit and a laser diode drive circuit shown in the block diagram in FIG. 8.

FIG. 9 is a schematic diagram showing one concrete example of the amplitude circuit 12 and the laser diode drive circuit 13 shown in FIG. 8.

Referring to FIG. 9, the amplitude circuit 12 comprises a circuit of a first stage connected between a power supply $V_{D1}$ and the ground $V_{SS}$ and a circuit of a second stage connected between a power supply $V_{D2}$ and the ground $V_{SS}$. The circuit of the first stage comprises an n channel field effect transistor 65 connected to a parallel connection which is formed between a series connection of a load 61 and an n channel field effect transistor 62 and a series connection of a load 63 and an n channel field effect transistor 64. The transistor 62 has its gate connected to an input $IN_1$ and the transistor 64 has its gate connected to an input $\overline{IN_1}$. The inputs $IN_1$ and $\overline{IN_1}$ are connected to receive signals of outputs $OUT_1$ and $\overline{OUT_1}$ of the multivibrator circuit of the present invention, respectively. The transistor 65 has its gate connected to a constant supply voltage $V_{C1}$. The circuit of the second stage comprises an n channel field effect transistor 67, two diodes 68 for level shifting and an n channel field effect transistor 69 connected in series between the power supply $V_{D2}$ and the ground $V_{SS}$. It further comprises an n channel field effect transistor 70, two diodes 71 for level shifting and an n channel field effect transistor 72 connected in series between the power supply $V_{D2}$ and the ground $V_{SS}$. The transistor 67 has its gate connected to the connection point between the load 61 and the transistor 62. The transistor 70 has its gate connected to the connection point between the load 63 and the transistor 64. The gate of the transistor 69 and the gate of the transistor 72 are connected together to a constant supply voltage $V_{C2}$.

In the laser diode drive circuit 13, a load 73 and an n channel field effect transistors 74 and 76 are connected in series between a power supply $V_{D3}$ and the ground $V_{SS}$. The transistor 74 has its gate connected to the connection point between the diodes 68 and the transistor 69. The transistor 76 has its gate connected to a constant supply voltage $V_{C3}$. A laser diode 14 and an n channel field effect transistor 77 are connected in series between a power supply $V_{D4}$ and the ground $V_{SS}$. The transistor 77 has its gate connected to an input $IN_2$. The input $IN_2$ is connected to receive an output signal of an APC circuit 15. An n channel field effect transistor 75 is connected between the connection point between the laser diode 14 and the transistor 77 and the connection point between the transistors 74 and 76. The transistor 75 has its gate connected to the connection point between the diode 71 and the transistor 72.

In operation of the high frequency superposed circuit shown in FIG. 9, the multivibrator circuit generates high frequency signal (several hundred MHz~several GHz) necessary to reduce the light induced noise due to return light of the laser diode and applies the same to the inputs $IN_1$ and $\overline{IN_1}$ of the amplitude circuit 12. The amplitude circuit 12 receives the high frequency signal and the laser diode amplifies this signal to a signal level necessary for oscillation in a mulltimode. Then, the laser diode drive circuit 13 receives the amplified high frequency signal to apply it to the laser diode 14. The laser diode drive circuit 13 also adjust a DC bias current flowing through the laser diode 14 in response to an output signal of the APC circuit 15 applied to the input $IN_2$. In addition, the amplitude circuit 12 may have an AGC (Automatic Gain Control) function to make an optimum adjustment of the output level of the high frequency superposed signal. As described above, by applying the multivibrator circuit to the high frequency superposed circuit shown in FIG. 8, the following advantages are brought about.

(1) A high frequency signal which is necessary to reduce the light induced noise due to return light of a laser diode can be readily obtained.

(2) A monolithic integration can be easily attained because a circuit can be formed using the same kind of compound semiconductors as that of laser diodes, e.g., GaAs field effect transistors.

(3) By employing a source-coupled type circuit, it is made easy to connect the same type, that is, source-coupled type amplitude circuit and laser diode drive circuit as shown in FIG. 9, for example.

(4) By employing a source-coupled type circuit, the circuit can be driven by a single power supply.

According to the present invention, since the multivibrator circuit is constructed using field effect devices, operation with a high oscillation frequency and low power consumption can be performed. In addition, according to the preferred embodiments, a multivibrator circuit is provided which the fluctuation of the oscillation frequency due to change of ambient temperature is prevented and the oscillation frequency can be changed in a stable manner from outside.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multivibrator circuit employing field effect devices comprising:
   a first power supply ($V_{DD1}$);
   a ground ($V_{SS}$);
   a first output ($OUT_1$) and a second output ($\overline{OUT_2}$) for outputting opposite output signals;
   a first series connection including a first voltage drop means ($R_1$, $D_1$) for dropping a voltage in response to a current flowing therein, a first field effect device ($Q_1$) of one conductivity type having one electrode, the other electrode and a control electrode, and first current source means ($Q_3$), provided between said first power supply ($V_{DD1}$) and said ground (VSS),
   said one electrode of said first field effect device ($Q_1$) being connected to said first voltage drop means ($R_1$, $D_1$), said other electrode of said first field effect device ($Q_1$) being connected to said first current source means ($Q_3$);

a second series connection including first level-shifting means ($Q_5$, $D_3$) and second current source means ($Q_7$), provided between said one electrode of said first field effect device ($Q_1$) and said ground ($V_{SS}$), a connection point between said first level-shifting means ($Q_5$, $D_3$) and said second current source means ($Q_7$) constituting said first output ($OUT_1$), said first level-shifting means ($Q_5$, $D_3$) receiving a voltage of said one electrode of said first field effect device ($Q_1$) and applying a level-shifted voltage to said first output ($OUT_1$);

a third series connection including second voltage drop means ($R_2$, $D_2$) for dropping a voltage in response to a current flowing therein, a second field effect device ($Q_2$) of one conductivity type having one electrode, the other electrode and a control electrode, and third current source means ($Q_4$) provided between said first power supply (VDD1) and said ground (VSS), said one electrode of said second field effect device ($Q_2$) being connected to said second voltage dropping means ($R_2$, $D_2$), said other electrode of said second field effect device ($Q_2$) being connected to said third current source means ($Q_4$), said control electrode of said second field effect device ($Q_2$) being connected to said first output ($OUT_1$);

temperature compensating means ($R_3$, $D_5$) connected to said first and third current source means ($Q_3$, $Q_4$) for compensating for a change in frequency of output signals outputted from said first and second outputs ($OUT_1$, $\overline{OUT_2}$) due to a change of ambient temperature;

capacitance means ($C_1$) connected between said respective the other electrode of said first field effect device ($Q_1$) and said second field device ($Q_2$); and a fourth series connection including second level-shifting means ($Q_6$, $D_4$) and fourth current source means ($Q_8$), provided between said one electrode of said second field effect device ($Q_2$) and said ground ($V_{SS}$), a connection point of said second level-shifting means ($Q_6$, $D_4$) and said fourth current source means ($Q_8$) constituting said second output ($\overline{OUT_2}$), said second level-shifting means ($Q_6$, $D_4$) receiving a voltage of said one electrode of said second field effect device ($Q_2$) and applying a level-shifted voltage to said second output ($\overline{OUT_2}$), said control electrode of said first field effect device ($Q_1$) being connected to said second output ($\overline{OUT_2}$).

2. A multivibrator circuit in accordance with claim 1, wherein said capacitance means further comprises means ($D_5$, $D_6$, $V_{CO}$) for changing a capacitance value from outside.

3. A multivibrator circuit in accordance with claim 1, wherein said first and third current source means ($Q_3$, $Q_4$) comprise third and fourth field effect devices ($Q_3$, $Q_4$) of one conductivity type each having one electrode, the other electrode and a control electrode, and further comprise a second power supply ($V_{CS1}$), said one electrode of said third field effect device ($Q_3$) being connected to said other electrode of said first field effect device ($Q_1$), said other electrode of said third field effect device ($Q_3$) being connected to said ground ($V_{SS}$), said one electrode of said fourth field effect device ($Q_4$) being connected to said other electrode of the second field effect device ($Q_2$), said other electrode of said fourth field effect device ($Q_4$) being connected to said ground ($V_{SS}$), said control electrodes of said third field effect device ($Q_3$) and said fourth field effect device ($Q_4$) being connected together to a first connection point ($N_5$), said first connection point ($N_5$) being connected to said second power supply ($V_{CS1}$).

4. A multivibrator circuit in accordance with claim 3 wherein said conductivity type comprises an n type.

5. A multivibrator circuit in accordance with claim 1, wherein said temperature compensating means comprises a first diode means ($D_5$) connected between (a) said first and third current source means and (b) said ground ($V_{SS}$).

6. A multivibrator circuit in accordance with claim 5, wherein said temperature compensating means further comprises first resistor means ($R_3$) connected between (a) said first and third current source means and (b) a first control input ($V_{CS1}$).

7. A multivibrator circuit in accordance with claim 1, wherein said first voltage drop means comprises a first parallel connection including second resistor means ($R_1$) and fourth diode means ($D_1$) provided between said first power supply ($V_{DD1}$) and said one electrode of said first field effect device ($Q_1$), and said second voltage dropping means comprises a second parallel connection including third resistor means ($R_2$) and fifth diode means ($D_2$), provided between said first power supply ($V_{DD1}$) and said one electrode of said second field effect device ($Q_2$).

8. A multivibrator circuit in accordance with claim 1, wherein said first level-shifting means comprises:

a second power supply ($V_{DD2}$); and a sixth series connection including a fifth field effect field ($Q_5$) of one conductivity type having one electrode, the other electrode and a control electrode, and sixth diode means ($D_3$), provided between said fourth power supply ($V_{DD2}$) and said first output ($OUT_1$), said one electrode of said fifth field effect device ($Q_5$) being connected to said fourth power supply ($V_{DD2}$), said other electrode of said fifth field effect device ($Q_5$) being connected to said sixth diode means ($D_3$), the control electrode of said fifth field effect device ($Q_5$) being connected to said one electrode of said first field effect device ($Q_1$), and wherein said second level shifting means comprises a seventh series connection including a sixth field effect device ($Q_6$) of one conductivity type having one electrode, the other electrode and a control electrode, and seventh diode means ($D_4$), said seventh series connection being provided between said fourth power supply ($V_{DD2}$) and said second output ($\overline{OUT_2}$), said one electrode of said sixth field effect device ($Q_6$) being connected to said fourth power supply ($V_{DD2}$), said other electrode of said sixth field effect device ($Q_6$) being connected to said seventh diode means ($D_4$), the control electrode of said sixth field effect device ($Q_6$) being connected to said one electrode of said second field effect device ($Q_2$).

9. A multivibrator circuit in accordance with claim 1, wherein said second current source means comprises a second power supply ($V_{CS2}$); and a seventh field effect device ($Q_7$) of one conductivity type having one electrode, the other electrode and a control electrode, said one electrode of said seventh field effect device ($Q_7$) being connected to said first output ($OUT_1$), said other electrode of said seventh field effect device ($Q_7$) being connected to said ground ($V_{SS}$), the control electrode of said seventh field effect device ($Q_7$) being connected to said fifth power supply ($V_{CS2}$), and wherein said fourth power supply means comprises a eighth field effect device ($Q_8$) of one conductivity type having one electrode, the other electrode and a control electrode, said one electrode of said eighth field effect device ($Q_8$) being connected to said second output ($\overline{OUT_2}$), said other electrode of said eighth field effect device ($Q_8$) being connected to said ground ($V_{SS}$), the control electrode of said eigth field effect device ($Q_8$) being connected to said fifth power supply ($V_{CS2}$).

10. A multivibrator circuit employing field effect devices comprising:

a first power supply ($V_{DD1}$);

a ground ($V_{SS}$);

a first output ($OUT_1$) and a second output ($\overline{OUT_2}$) for outputting opposite output signals;

a first series connection including a first voltage drop means ($R_1$, $D_1$) for dropping a voltage in response to a current flowing therein, a first field effect device ($Q_1$) of one conductivity type having one electrode, the other electrode and a control electrode, and first current source means ($Q_3$), provided between said first power supply ($V_{DD1}$) and said ground (VSS), said one electrode of said first field effect device ($Q_1$) being connected to said first voltage drop means ($R_1$, $D_1$), said other electrode of said first field effect device ($Q_1$) being connected to said first current source means ($Q_3$);

a second series connection including first level-shifting means ($Q_5$, $D_3$) and second current source means ($Q_7$), provided between said one electrode of said first field effect device ($Q_1$) and said ground ($V_{SS}$), a connection point between said first level-shifting means ($Q_5$, $D_3$) and said second current source means ($Q_7$) constituting said first output ($OUT_1$), said first level-shifting means ($Q_5$, $D_3$) receiving a voltage of said one electrode of said first field effect device ($Q_1$) and applying a level-shifted voltage to said first output ($OUT_1$);

a third series connection including second voltage drop means ($R_2$, $D_2$) for dropping a voltage in response to a current flowing therein, a second field effect device ($Q_2$) of one conductivity type having one electrode, the other electrode and a control electrode, and third current source means ($Q_4$) provided between said first power supply (VDD1) and said ground (VSS), said one electrode of said second field effect device ($Q_2$) being connected to said second voltage dropping means ($R_2$, $D_2$), said other electrode of said second field effect device ($Q_2$) being connected to said third current source means ($Q_4$), said control electrode of said second field effect device ($Q_2$) being connected to said first output ($OUT_1$);

capacitance means ($C_1$) connected between said respective the other electrode of said first field effect device ($Q_1$) and said second field device ($Q_2$), said capacitance means including means ($D_5$, $D_6$, $V_{CO}$) for changing a capacitance value; and a fourth series connection including second level-shifting means ($Q_6$, $D_4$) and fourth current source means ($Q_8$), provided between said one electrode of said second field effect device ($Q_2$) and said ground ($V_{SS}$), a connection point of said second level-shifting means ($Q_6$, $D_4$) and said fourth current source means ($Q_8$) constituting said second output ($\overline{OUT_2}$), said second level-shifting means ($Q_6$, $D_4$) receiving a voltage of said one electrode of said second field effect device ($Q_2$) and applying a level-shifted voltage to said second output ($\overline{OUT_2}$), said control electrode of said first field effect device ($Q_1$) being connected to said second output ($\overline{OUT_2}$), said capacitance changing means including a fifth series connection including second diode means ($D_5$) and third diode means ($D_6$) of polarities opposite to each other, provided between said other electrode of said first field effect device ($Q_1$) and said other electrode of said second field effect device ($Q_2$), and a third power supply ($V_{CO}$) for applying a voltage to change a capacitance value of said capacitance changing means to a connection point between said second and third diode elements ($D_5$, $D_6$).

* * * * *